US006670787B2

United States Patent
Tachibana

(10) Patent No.: US 6,670,787 B2
(45) Date of Patent: Dec. 30, 2003

(54) SOLAR BATTERY MODULE WITH COVER MEMBER AND METHOD OF FABRICATING THE SAME

(75) Inventor: Shingo Tachibana, deceased, late of Osaka (JP), by Megumi Tachibana, legal representative

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/183,959

(22) Filed: Jun. 28, 2002

(65) Prior Publication Data

US 2003/0006730 A1 Jan. 9, 2003

(30) Foreign Application Priority Data

Jun. 29, 2001 (JP) .......................... 2001-198911
Apr. 3, 2002 (JP) .......................... 2002-101435

(51) Int. Cl.[7] .............................................. H01M 10/46
(52) U.S. Cl. .................................... 320/101; 136/244
(58) Field of Search ............................. 320/101, 116, 320/118, 119, 123; 136/244, 252, 291, 293; D13/103, 105

(56) References Cited

U.S. PATENT DOCUMENTS

| 3,819,417 A | * | 6/1974 | Haynes |
| 4,173,496 A | * | 11/1979 | Chiang et al. |
| 4,443,652 A | * | 4/1984 | Izu et al. |
| 5,121,818 A | * | 6/1992 | McComic |

FOREIGN PATENT DOCUMENTS

| JP | 9-260707 | 10/1997 |
| JP | 10-102708 | 4/1998 |
| JP | 11-312820 | 11/1999 |

* cited by examiner

*Primary Examiner*—Edward H. Tso
(74) *Attorney, Agent, or Firm*—Nixon & Vanderhye P.C.

(57) ABSTRACT

A solar battery module has a plurality of solar battery cells linearly arranged and electrically connected together to form a cell unit and more than one cell unit are arranged laterally side by side and solar battery cells located at opposite ends of the cell unit and adjacent to each other are electrically connected by first to fifth interconnection members to allow a matrix of the solar battery cells to be entirely connected in series, characterized in that the interconnection member excluding a portion thereof for connection is at least partially covered by an insulative cover member.

10 Claims, 13 Drawing Sheets

REAR COVER USING CONDUCTIVE MEMBER

REAR COVER USING CONDUCTIVE MEMBER

US 6,670,787 B2

SOLAR BATTERY MODULE WITH COVER MEMBER AND METHOD OF FABRICATING THE SAME

BACKGROUND OF THE INVENTION

1. Field of the Invention

The present invention relates generally to solar battery modules and particularly to those fabricated by a process with a simplified interconnection step, providing improved insulation as a solar battery module and improved in design, and methods of fabricating the same.

2. Description of the Background Art

A conventional solar battery module is structured, as shown in FIGS. 13A–18C.

A solar battery module 1 is structured as follows: a plurality of solar battery cells 11 (nine cells in this example) are linearly arranged and electrically connected by a connection member 12 to form a cell unit (hereinafter referred to as a "string") 13. A plurality of strings 13 (six strings in this example) are arranged laterally side by side and solar battery cells located at opposite ends of the cell units and adjacent to each other (cells 11a1 and 11a2, 11b1 and 11b2, 11c1 and 11c2, 11d1 and 11d2, 11e1 and 11e2) are electrically connected by a connection member 14 to allow a matrix of solar battery cells (hereinafter simply referred to as a "matrix") 15 to be entirely connected in series.

Then, as shown in FIG. 16, matrix 15 thus electrically connected has a lower surface with a sheet of filler resin (e.g., ethylene vinyl acetate (EVA)) 16 and a rear cover (a back film) 17 arranged adjacent thereto and also has an upper surface (a light receiving surface) with a sheet of filler resin (e.g., EVA) 18 and a front cover (of glass) 19 arranged adjacent thereto, with their respective peripheries together surrounded by a frame member of aluminum 20 (see FIG. 18B). Rear cover 17, front cover 19, filler resin 16, 18 and frame member 20 ensure strength, moisture resistance, and insulation.

Solar battery module 1 structured as above is fabricated, as follows: as shown in FIG. 13A, nine solar battery cells 11 are arranged linearly (laterally in a row) and cells 11 adjacent to each other are connected together by connection member 12 in order electrically to form string 13.

FIG. 14A is a cross section of FIG. 13B taken along a line XIV–XIV', showing a portion of string 13, as seen laterally. Connection member 12 has a buckle 12a substantially at its center. Buckle 12a corresponds to a thickness of solar battery cell 11. Via buckle 12a one portion for connection 12b is connected to solar battery cell 11 on a front side (the side of a negative electrode) 11a and the other portion for connection 12c is connected to an adjacent solar battery cell 11 on a bottom side (the side of a positive electrode) 11b. As shown in FIG. 14B, connection member 12 is a copper wire in an elongate plate having a surface plated with solder and it has a width of approximately 1.5 mm and a thickness of 0.15 mm.

Six of such strings 13 are arranged laterally side by side and the solar battery cells located at opposite ends of the strings and adjacent to each other (cells 11a1 and 11a2, 11b1 and 11b2, 11c1 and 11c2, 11d1 and 11d2, 11e 1 and 11e2) are electrically connected together by interconnection member 14 to fabricate matrix 15. Interconnection member 14 is also a copper wire in elongate flat plate having a surface plated with solder and two types thereof are prepared, one having a width of approximately 1.5 mm and a thickness of 0.15 mm and the other having a width of approximately 6 mm and a thickness of approximately 0.23 mm.

FIG. 15 shows solar battery cells connected together by interconnection member 14, as seen in matrix 15 from a lower side.

More specifically, from a reel of a flat copper line of approximately 1.5 mm in width and a reel of a flat copper line of approximately 6 mm in thickness the copper lines are extracted and each cut to have a required length to form interconnection member 14 required for connection. Note that in cutting interconnection member 14 out, five first pieces for linkage 14a, 14a' . . . are cut from the 6 mm width flat copper line for laterally connecting adjacent solar battery cells (11a1 and 11a2, 11b1 and 11b2, 11c1 and 11c2, 11d1 and 11d2, 11e1 and 11e2) together and ten pieces for protrusion 14b, 14b' . . . are cut from the flat copper line of 1.5 mm in width and 0.15 mm in thickness for connecting the first piece for linkage 14a, 14a' and an electrode of the bottom side of each of positionally lower ones 11a2, 11b2, 11c2, 11d2 and 11e2 of the adjacent solar battery cells.

Furthermore, in FIG. 15, two second pieces for linkage 14c are cut from the flat copper line of 6 mm in width and 0.23 mm in thickness to provide a lateral connection between an electrode of the bottom side of solar battery cell 11f and an electrical output port 15a provided on one side of matrix 15 at a center, formed at rear cover 17, and between the other portion for connection 12c of connection member 12 attached to solar battery cell 11g and an electrical output port 25b provided on one side of matrix 15 at a center, formed at rear cover 17, and two pieces for protrusion 14d are cut from the 6 mm width flat cover line to provide a connection between the second pieces for linkage 14c tips and electrical output ports 25a, 25b. Furthermore in FIG. 15 two pieces for protrusion 14b are cut from the flat copper line of 1.5 mm in width and 0.15 mm in thickness to connect the second piece for connection 14c and an electrode of the bottom side of solar battery cell 11f.

Furthermore in FIG. 15 two pieces for protrusion 14e are cut from the 6 mm width flat cover plate for connection to the first pieces for linkage 14a at their respective ends closer to the center to connect a bypass diode (not shown) in a vicinity of electrical output ports 25a, 25b.

All the required members (pieces) cut from the flat copper lines for interconnection member 14 are then soldered for example with a soldering iron in order.

More specifically in FIG. 15 each of the three first pieces for linkage 14a and the two pieces for protrusion 14b are soldered together and thus joint generally in a letter F inverted and upside down. Then each of the first pieces for linkage 14a with pieces 14b is arranged along a right-hand edge of matrix 15, and a portion thereof for connection opposite that has two pieces for protrusion 14b connected thereto with solder and the other portions for connection 12c of connection member 12 attached to a respective upper one of the adjacent solar battery cells, i.e., cells 11a1, 11c1, 11e1 are soldered and thus connected together, and the pieces for protrusion 14b and an electrode of the bottom side of each of lower ones of the adjacent solar battery cells, i.e., cells 11a2, 11c2, 11e2 are soldered and thus connected together.

Furthermore in FIG. 15 the two first pieces for linkage 14a' arranged at the center and two pieces for protrusion 14b' are soldered and thus connected in a letter F inverted and upside down, and each piece 14a' has a tip with a piece for protrusion 14e soldered and thus bonded thereto for connecting a bypass diode. Each piece 14a' with pieces 14b' and 14e is arranged along a left-hand edge of matrix 15, and that portion of the first piece 14a' for linkage which is opposite that having pieces 14b' soldered and thus connected thereto and the other portions for connection 12c of connection member 12 attached to a corresponding one of upper ones of the adjacent solar battery cells, i.e., cells 11b1, 11d1 are soldered and connected together, and pieces 14b' and an electrode of the bottom side of a corresponding one of lower ones of the adjacent solar battery cells, i.e., cells 11b2, 11d2 are soldered and thus connected together.

Furthermore in FIG. 15 the second piece for linkage 14c arranged upper than the center of matrix 15 has an upper portion with two pieces for protrusion 14b soldered and connected thereto and a lower portion with a single piece for protrusion 14d soldered and thus connected thereto and the second piece 14c with pieces 14b and 14d is then arranged along matrix 15, and pieces 14b are soldered and thus connected to an electrode of the bottom side of solar battery cell 11b and piece 14d is guided externally from electrical output port 25a.

The second piece for linkage 14c arranged lower than the center of matrix 15 has an upper portion with a single piece for protrusion 14d soldered and thus connected thereto and the second piece 14c with piece 14d is then arranged along a lower left edge of matrix 15, and a lower portion of the second piece for linkage 14c and the other portions for connection 12c of connection member 12 attached to solar battery cell 11g are soldered and thus connected together and piece 14d is guided externally from electrical output port 25b.

Matrix 15 thus has interconnection member 14 connected thereto to electrically connect all of the 54 solar battery cells 11 in series. Note that the other portion for connection 12c after it is soldered and connected has an unnecessary portion (a protrusion) cut and removed.

Note that in FIG. 15 a portion soldered and connected is shown circled. As can be seen from FIG. 15, the conventional fabrication method requires that 42 portions be soldered and connected, one by one manually.

Then, as shown in FIG. 16, rear cover 17, the sheet of filler resin 16, matrix 15, the sheet of filler resin 18 and front cover 19 are stacked in order and they are heated and undergo vacuum lamination to seal solar cells 11. FIG. 17 is a cross section showing an enlargement of a portion of a structure sealing solar battery cell 11. Although not described in the above, the structure has an end sealed with silicone resin 21.

In such a fabrication method as described above, connection member 12 connecting solar battery cells and interconnection member 14 arranged on opposite sides of matrix 15 for laterally connecting solar battery cells are a copper wire in the form of a flat plate plated with solder. This is because connection member 12 and interconnection member 14 are finally sealed by filler resin (EVA resin) 16, 17 and silicone resin 21 and for the facility of an interconnection process by means of soldering a covering for insulation, water proof and the like is not required.

Some solar battery module structures, however, require that interconnection member 14 be arranged at a location short-circuiting with solar battery cell 11 or that interconnection materials 14 be arranged to traverse each other. Furthermore, they require that while rear cover 17 is formed of a conductive member, interconnection member 14 penetrate therethrough or that while frame member 20 of aluminum is used, an electrical output be extracted from an end surface located between front cover 19 and rear cover 17.

In such a case for example if interconnection member 14 needs to penetrate rear cover 17 then, as shown in FIG. 18A, an insulation film 22 is required to surround a through hole 17a for rear cover 17 and be inserted between the interconnection member 14 and solar battery cell 11 to ensure insulation between and interconnection member 14 the solar battery cell 11 and if an electrical output needs to be extracted from an end surface located between front cover 19 and rear cover 17 then, as shown in FIG. 18B, insulation film 22 needs to be inserted at an end of rear cover 27 and also at an internal surface of frame member 20 to ensure insulation between the frame member and interconnection member 14. Furthermore, if interconnection materials 14 need to be arranged to traverse each other then, as shown in FIG. 18C, they are stuck with an insulation tape 23 with a predetermined distance posed therebetween to ensure insulation therebetween. This entails a significantly cumbersome step in a solar battery module production process to ensure insulation between interconnection member 14 and other members.

Furthermore in the conventional fabrication method when six strings 13 are arranged laterally side by side and connected by interconnection member 14 in matrix 15 as many as 42 portions need to be soldered for connection, which is a manual and hence time-consuming step.

The main stream of recent solar battery modules is shifting from conventional, industrial purposes to general, residential purposes, and for the latter purposes, design has been an important issue. Interconnection material 14 is plated with solder, as has been described above, and its surface is silver in color, and silver interconnection member 14 is disadvantageously noticeable relative to a color of a surface of a solar battery module entirely fabricated in black. Accordingly, there is an increased demand for coloring an interconnection member disadvantageously observed in appearance.

Furthermore, typically a solar battery module has an end surface sealed with a member, such as shown in FIG. 17, e.g., silicone resin 21 and filler resin (EVA resin) 16, 17, or other similar material which liquefies once in fabricating the solar battery module. As such, air bubbles form or the material peels off and can result in an insufficiently insulated product.

SUMMARY OF THE INVENTION

The present invention has been made to overcome the above disadvantages and it contemplates a solar battery module and particularly to that fabricated by a process with a simplified interconnection step, providing improved insulation as a solar battery module and improved in design, and methods of fabricating the same.

The present invention in one aspect provides a solar battery module having a plurality of solar battery cells linearly arranged and electrically connected together to form a cell unit, more than one cell unit being arranged laterally side by side, either solar battery cells located at opposite ends of the cell units and adjacent to each other or an electrical output port and the solar battery cell being electrically connected by an interconnection member to allow a matrix of the solar battery cells to be entirely connected in series, characterized in that the interconnection member excluding a portion thereof for connection is at least partially covered by a cover member.

Preferably, the interconnection member is a conductive electric wire in a form of a flat plate, the cover member is an insulative member, and the cover member is similar or different in color to or from a member surrounding the cover member.

More preferably, the interconnection member connects adjacent solar battery cells together and the interconnection member excluding a portion thereof for connection is formed in a covered geometry.

Still more preferably, the interconnection member electrically connects the solar battery cell and a terminal external to the electrical output port together and the interconnection member excluding a portion thereof for connection is formed in a covered geometry.

Still more preferably, the interconnection member has a portion for connection either on a piece for linkage of the interconnection member at an interval or protruding from the piece for linkage outwards.

Preferably, the interconnection member is integrally formed generally in a letter L, F or E to match a site for connection.

The present invention in another aspect provides a method of fabricating a solar battery module, comprising the steps of: a) linearly arranging and electrically connecting a plurality of solar battery cells together to form a cell unit; and b) arranging more than one cell unit laterally side by side and electrically connecting either the solar battery cells located at opposite ends of the cell units and adjacent to each other or an electrical output port and the solar battery cell together by an interconnection member, characterized in that the interconnection member is formed to match a geometry of a site for connection and in the step b) the interconnection member thus formed is arranged at the site for connection and a connection terminal of the solar battery cell and a portion of the interconnection member for connection are soldered and thus connected to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
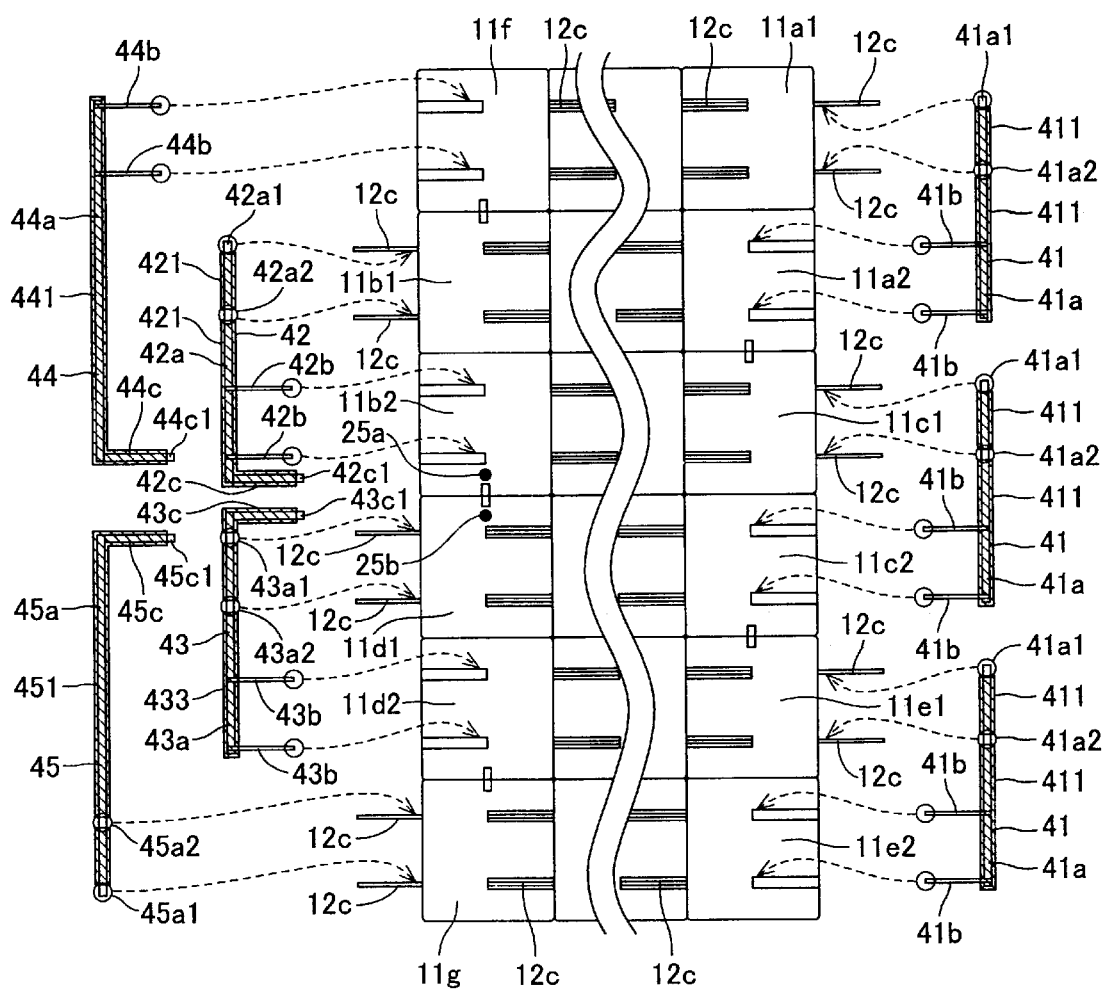
FIGS. 1–4 are each a plan view of a matrix configuring a solar battery module of the present invention, and seen from a lower side thereof.

The present invention in one aspect provides a solar battery module having a plurality of solar battery cells linearly arranged and electrically connected together to form a cell unit, more than one cell unit being arranged laterally side by side, solar battery cells located at opposite ends of the cell units and adjacent to each other being electrically connected by an interconnection member to allow a matrix of the solar battery cells to be entirely connected in series, characterized in that the interconnection member excluding a portion thereof for connection is at least partially covered by an insulative cover member. Thus covering the connection member can improve insulation and design.

In this case if the connection member is a conductive electric wire in the form of a flat plate it has a large width and accordingly provides disturbance in appearance. By covering it with the cover member, it can be less noticeable. Furthermore, the cover member that is similar in color to a member surrounding the same can be integrated into a color of a surface of the solar battery module and thus provide a further improvement in design. By contrast, the cover member that is different in color from the surrounding member to be a factor in design can also provide an improvement in design.

Furthermore, a solar battery module has an end surface sealed typically with a member formed of silicone resin, EVA resin or other similar material that liquefies once in fabricating the solar battery module. As such, air bubbles readily form and the member readily peels off. In the present invention, the interconnection member can be covered with an insulative member and the isolation between the interconnection member and other surrounding members can sufficiently be ensured.

Furthermore in the solar battery module of the present invention adjacent solar battery cells are connected together by an electrical interconnection member formed in a connectable geometry, characteristically for example generally in a letter L, F or E to match a site for connection. The interconnection member thus integrated to be a single member can simplify soldering for connection in a solar battery module production process at an interconnection step in particular and thus significantly reduce process time.

Furthermore the present invention provides a method of fabricating a solar battery module, including the steps of: a) linearly arranging and electrically connecting a plurality of solar battery cells together to form a cell unit; and b) arranging more than one cell unit laterally side by side and electrically connecting the solar battery cells located at opposite ends of the cell units and adjacent to each other together by an interconnection member, characterized in that the interconnection member is formed to match a geometry of a site for connection and in the step b) the interconnection member thus formed is arranged at the site for connection and a connection terminal of the solar battery cell and a portion of the interconnection member for connection are soldered and thus connected to each other. The interconnection member thus integrated to be a single member can simplify soldering for connection in a solar battery module production process at an interconnection step in particular and thus significantly reduce process time.

Matrix

Figure 2:
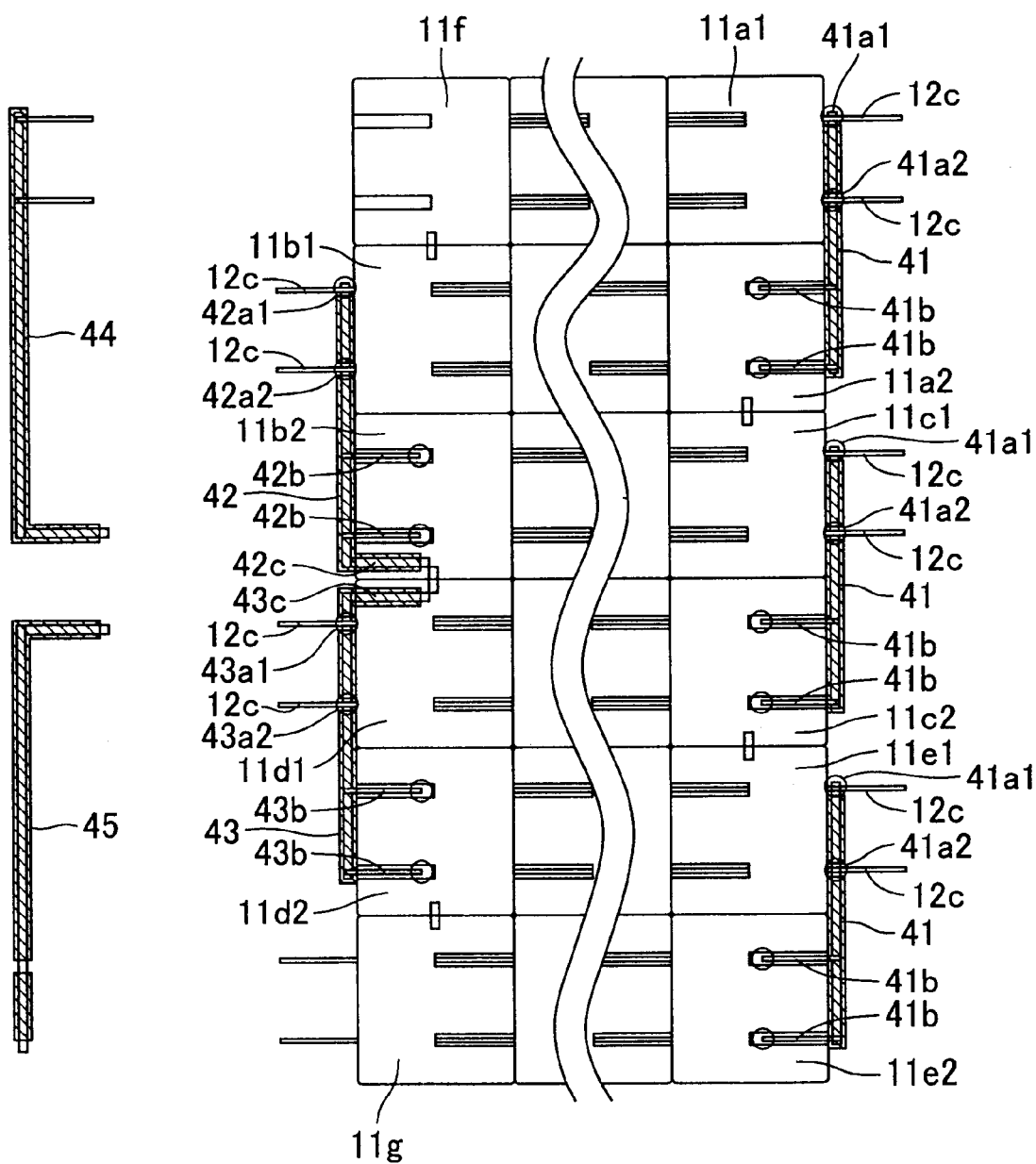
Figure 3:
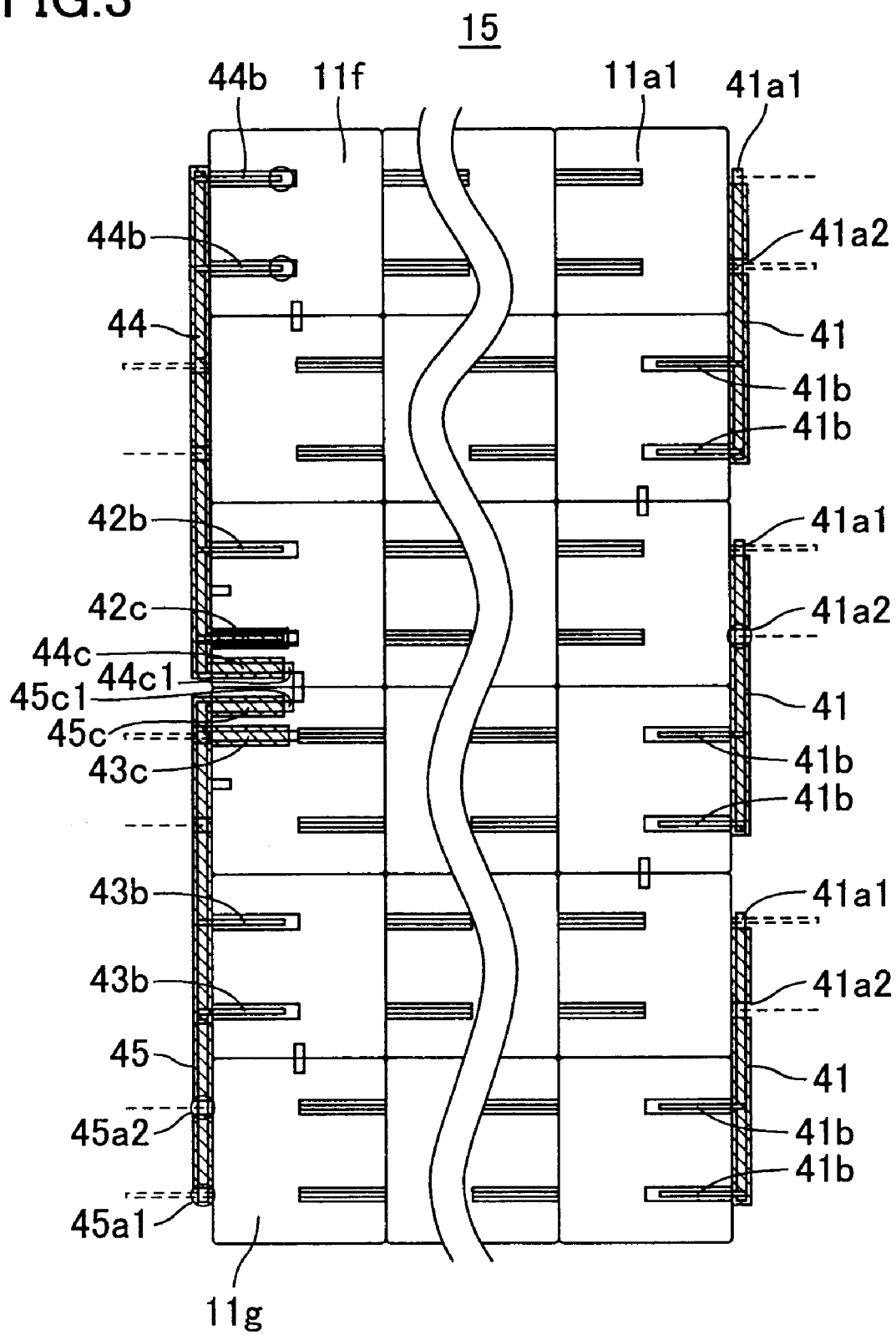

FIGS. 1–3 are plan views of a matrix 15 as a constituent of a solar battery module of the present invention, showing an interconnection procedure at an interconnection step in particular. Note that components and portions employed in both the present invention and the solar battery module referred to in the description of the conventional art are labeled identically and thus will not be described in detail hereinafter.

For matrix 15, as has been described in the conventional art, a plurality of solar battery cells 11 (nine cells in this embodiment) are linearly arranged and electrically connected by a connection member 12 to form a string 13. A plurality of strings 13 (six strings in this example) are arranged laterally side by side and solar battery cells located at opposite ends of the strings and adjacent to each other (cells 11a1 and 11a2, 11b1 and 11b2, 11c1 and 11c2, 11d1 and 11d2, 11e1 and 11e2) are electrically connected by an interconnection member 41–45 to electrically connect all of the 54 cells 11 in series.

The present invention is characterized by a configuration of interconnection members 41–45, which are formed to have a geometry capable of connecting adjacent solar battery cells (11a1 and 11a2, 11b 1 and 11b2, 11d1 and 11c2, 11d1 and 11d2, 11e1 and 11e2) together. More specifically, they are formed for example generally in a letter L or F to match a site for connection and they may be formed to match various the site for connection of various geometries, and in the present embodiment seven formed interconnection members of five types are necessary to accommodate a method of arranging solar battery cells 11, a direction of an electrode, a position of an electrical output port, and the like. Hereinafter, each interconnection member will be described individually.

Interconnection Member

FIGS. 6–10 are each a perspective view of an interconnection member of the present embodiment. The connection members are of types, as shown in FIG. 1: a first interconnection member 41 (also see FIG. 6) for laterally linking solar battery cells 11a1 and 11a2, 11b 1 and 11b2, 11c1 and 11c2, 11d1 and 11d2, 11e1 and 11e2 arranged along a side edge opposite to electrical output ports 25a and 25b and adjacent to each other; a second interconnection member 42 (also see FIG. 7) for laterally linking adjacent solar battery cells 11b 1, 11b2 arranged along a side edge closer to electrical output ports 25a and 25b and located upper than a center of the side edge; a third interconnection member 43 (also see FIG. 8) for laterally linking solar battery cells 11d1 and 11d2 located lower than the center and adjacent to each other; a fourth interconnection member 44 (also see FIG. 9) mechanically linked to an electrode of the bottom side of solar battery cell 11f and electrical output port 25a and electrically connected to an external terminal; and a fifth interconnection member 45 (also see FIG. 10) mechanically linked to a portion for connection 12c of solar battery cell 11g and electrical output port 25b and electrically connected to an external terminal, for the total of five types. Since three such first interconnection members 41 are required, seven interconnection members of the five types are required in total. External to electrical output port 25 there exits a terminal for example of a diode external cable and the interconnection members connected to the electrical output ports are electrically connected to such terminals.

First Interconnection Member

Figure 6:
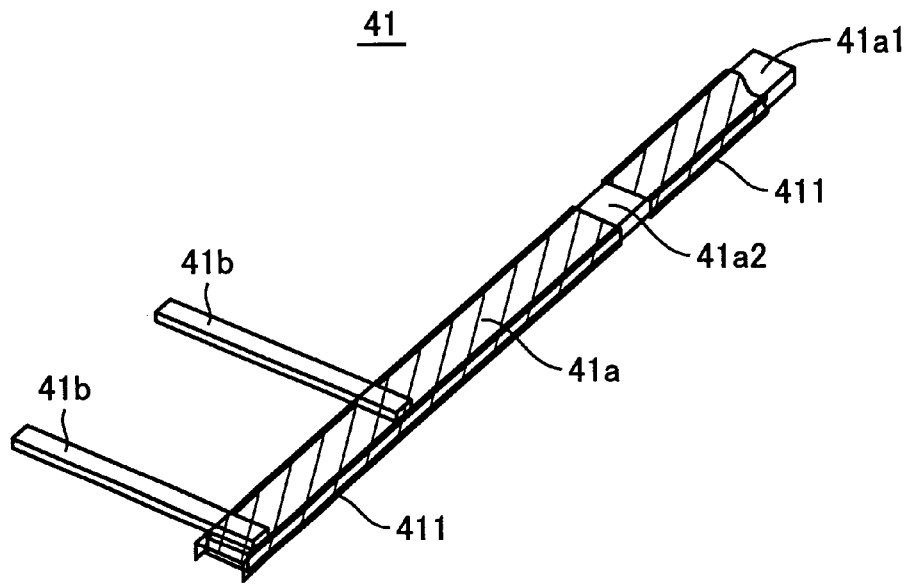
FIGS. 6–10 are perspective views showing first to fourth interconnection members, respectively, in accordance with the present embodiment.

In FIG. 6, the first interconnection member 41 is formed of a piece for linkage 41a having a width of 6 mm and a thickness of 0.23 mm and two pieces for protrusion 41b having a width of 1.5 mm and a thickness of 0.15 mm for connecting an electrode of the bottom side of each of solar battery cells 11a2, 11c2 and 11e2 (see FIG. 1) and piece 41a together. Piece 41a and pieces 41b are soldered and thus connected to together form generally a letter F. Alternatively, it may be punched out and thus integrally formed. Piece 41a thus formed is entirely covered with an insulative cover member 41a (hatched in the figure). It should be noted, however, that an end 41a1 of piece 41a opposite to that with pieces 41b and a portion 41a2 located between end 41a1 and the center of piece 41a and closer to the center are spaced by a predetermined distance and they are exposed, having cover member 411 removed therefrom. These exposed portions 41a1 and 41a2 are soldered and thus connected to the other portions for connection 12c of connection member 12 attached to solar battery cells 11a1, 11c1 and 11e11 (see FIG. 1).

Second Interconnection Member

Figure 7:
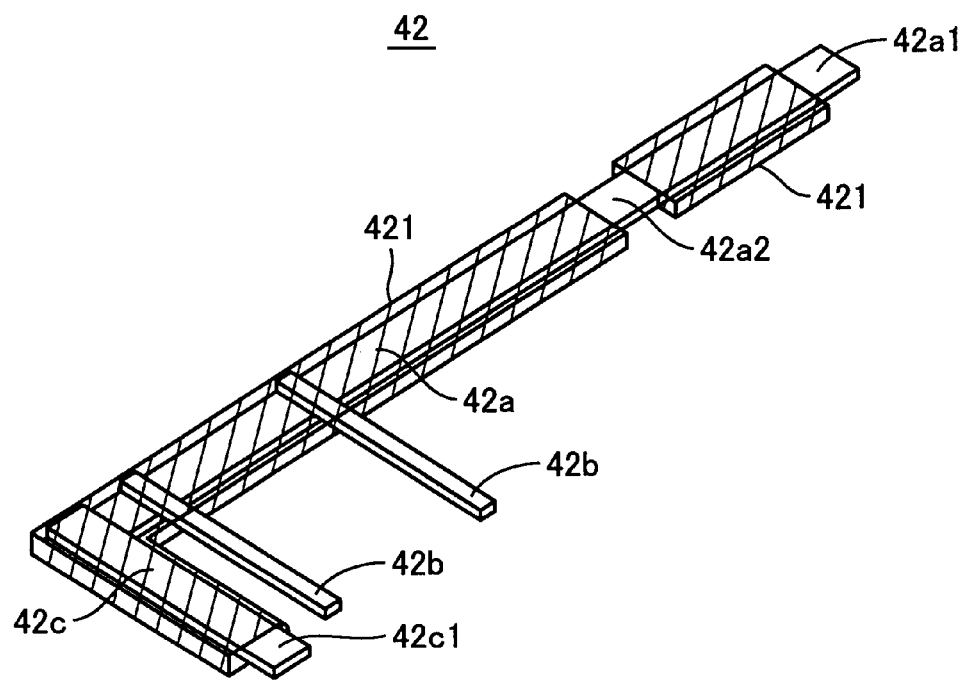

In FIG. 7, the second interconnection member 42 is formed of a piece for linkage 42a having a width of 6 mm and a thickness of 0.23 mm, two pieces for protrusion 42b having a width of 1.5 mm and a thickness of 0.15 mm for connecting an electrode of the bottom side of solar battery cell 11b2 (see FIG. 1) and piece 42a together, and a piece for protrusion 42c having a width of 6 mm and a thickness of 0.23 mm and connected to a portion of piece 42a located outer than the two pieces 42b. These pieces 42a–42c are soldered and thus connected to together form generally a letter F. Pieces 42a and 42c thus connected are entirely covered with an insulative cover member 421 (hatched in the figure). It should be noted, however, that an end 42a1 of piece 42a opposite to that with piece 42c, a portion 42a2 located between end 42a1 and the center of piece 42a and closer to the center, and a tip 42c1 of piece 42c are exposed, having cover member 421 removed therefrom. Note that exposed portions 42a1 and 42a2 are spaced by a predetermined distance. Exposed portions 42a1 and 42a2 are those soldered and thus connected to the other portions for connection 12c of connection member 12 attached to solar battery cell 11b 1 (see FIG. 1), and exposed portion 42c1 serves as a portion connecting a bypass diode described later.

Third Interconnection Member

Figure 8:
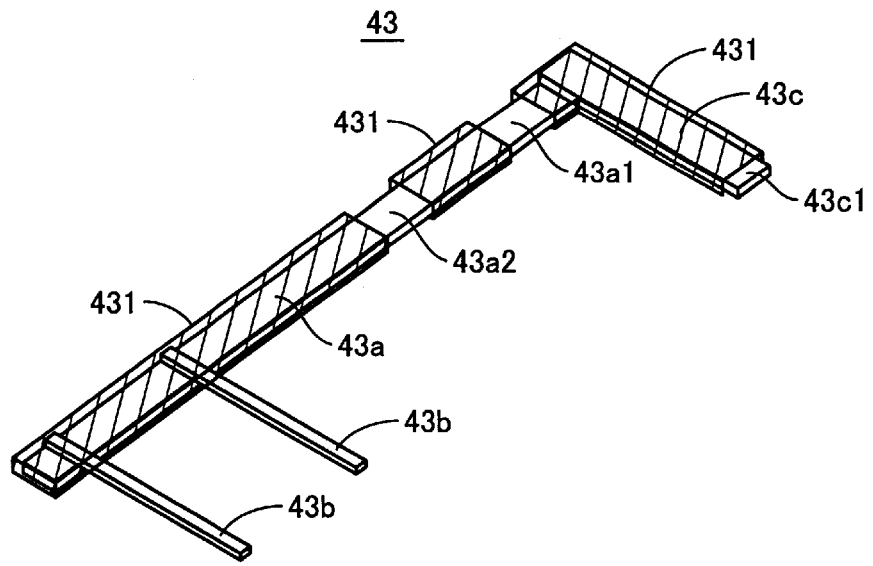

In FIG. 8, the third interconnection member 43 is formed of a piece for linkage 43a having a width of 6 mm and a thickness of 0.23 mm, two pieces for protrusion 43b having a width of 1.5 mm for connecting an electrode of the bottom side of solar battery cell 11d2 (see FIG. 1) and piece 43a together, and a piece for protrusion 43c having a width of 6 mm and a thickness of 0.23 mm and connected to an end of piece 43a opposite to that with the two pieces 43b. Pieces 43a–43c are soldered and thus connected to together form generally a letter E. Pieces 43a and 43c thus connected are entirely covered with an insulative cover member 431 (hatched in the figure). It should be noted, however, that a portion 43a1 of piece 43a closer to piece 43c, a portion 43a2 located between portion 43a1 and the center of piece 43a and closer to the center, and a tip 43c1 of piece 43c are exposed, having cover member 431 removed therefrom. Note that exposed portions 43a1 and 43a2 are spaced by a predetermined distance. Exposed portions 43a1 and 43a2 are those soldered and thus connected to the other portions for connection 12c of connection member 12 attached to solar battery cell 11d1 (see FIG. 1), and exposed portion 43c1 serves as a portion connecting a bypass diode described later.

Fourth Interconnection Member

Figure 9:
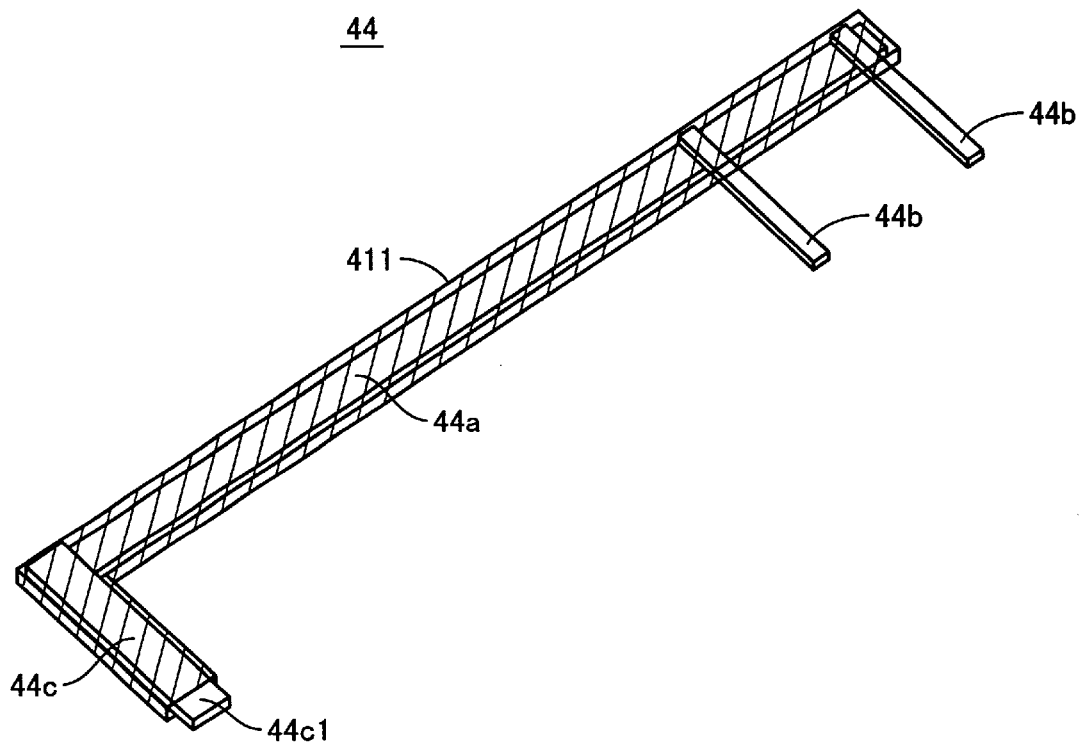

In FIG. 9, the fourth interconnection member 44 is formed of a piece for linkage 44a having a width of 6 mm and a thickness of 0.23 mm for laterally connecting an electrode of the bottom side of solar battery cell 11f and an electrical output port 25a of matrix 15, two pieces for protrusion 44b having a width of 1.5 mm and a thickness of 0.15 mm for connecting an electrode of the bottom side of solar battery cell 11f and piece 44a, and a piece for protrusion 44c having a width of 6 mm and a thickness of 0.23 mm and connected to an end of piece 44a opposite to that with the two pieces 44b. Pieces 44a–44c are soldered and thus connected to together form generally a letter E. Pieces 44a and 44c thus connected are entirely covered with an insulative cover member 441 (hatched in the figure). It should be noted, however, that piece 44c has a tip 44c1 exposed, having cover member 441 removed therefrom. Pieces 44b are those soldered and thus connected to an electrode of the bottom side of solar battery cell 11f, and exposed portion 44c1 serves as a portion guided externally from electrical output port 25a.

Fifth Interconnection Member

Figure 10:
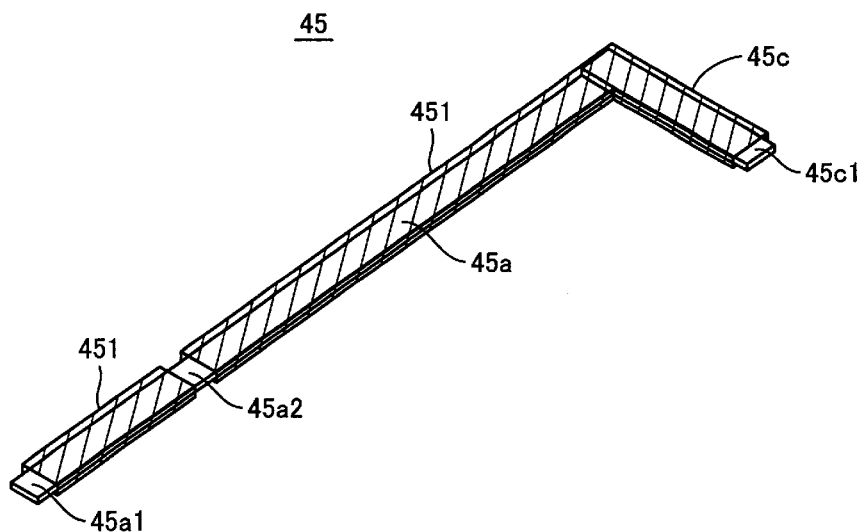

In FIG. 10, the fifth interconnection member 45 is formed of a piece for linkage 45a having a width of 6 mm and a thickness of 0.23 mm for laterally linking and thus connecting the other portions for connection 12c of connection member 12 attached to a lower and left solar battery cell 11g and an electrical output port 25b provided on a left hand of matrix 15 at the center, and a piece for protrusion 45c having a width of 6 mm and a thickness of 0.23 mm and connected to one end of piece 45a. Pieces 45a and 45c are soldered and thus connected to together form generally a letter L. Pieces 45a and 45c thus connected are entirely covered with an insulative cover member 451 (hatched in the figure). It should be noted, however, the other end 45a1 of piece 45a, a portion 45a2 located between end 45a1 and the center of piece 45a and closer to the center, and a tip 45c1 of piece 45c are exposed, having cover member 451 removed therefrom. Note that exposed portions 45a1 and 45a2 are spaced by a predetermined distance. Exposed portions 45a1 and 45a2 are those soldered and thus connected to the other portions for connection 12c of connection member 12 provided to solar battery cell 11g, and exposed portion 45c1 serves as a portion guided externally from electrical output port 25b.

Method of Fabricating the Interconnection Members

Figure 11A:
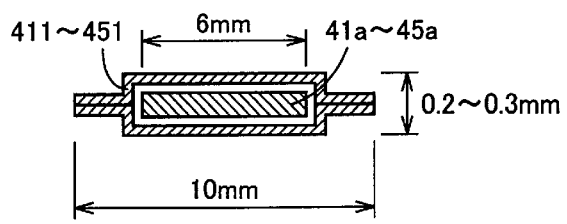
FIGS. 11A and 11B are each a cross section of one example of a structure of a cover portion of the first to fifth interconnection members.
Figure 11B:
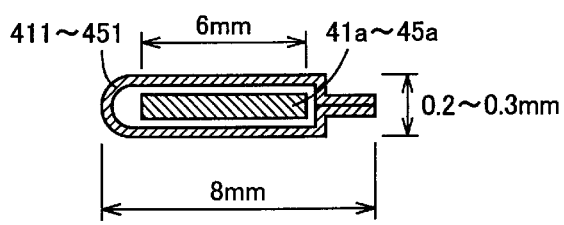

FIGS. 11A and 11B each show an example in cross section of a covered portion of the first to fifth interconnection members 41–45. The figures also indicate a dimension of each portion in one embodiment.

The first to fifth interconnection members 41–45 are fabricated, as follows: solder plated copper lines or the like of 6 mm and 1.5 mm in width and 0.23 mm and 0.15 mm in thickness are soldered to form generally a letter F, E, L, or the like and they are thus integrated to provide formations of copper lines 41a–45a. Formations 41a–45a are surrounded by film 411–451, for example PET film or other similar film capable of insulation and providing different colors. Adhesive, double-faced adhesive tape or the like is used to surround the formation with the film.

More specifically, the formation is sandwiched by two sheets of insulative film 411–451, as shown in FIG. 11A, or a single sheet of insulative film 411–451 folded in two, as shown in FIG. 11B. In either manner, the formation can be covered, although using a single sheet of insulative film folded in two would be a superior manner in ensuring insulation, since the formation in bonding less displaces. In doing so, it is necessary to previously vacuum-laminate or degas the entirety of the completed interconnection member 41–45 to prevent formation of air bubbles or the like, since at a subsequent step when it is processed into a solar battery module it is laminated by EVA itself. Furthermore it is also necessary to select the adhesive, double-faced adhesive tape or the like not to disadvantageously affect the EVA resin. Furthermore, the first to fifth interconnection members 41–45 are connected mainly with solder and accordingly cover members 411–451 preferably have superior thermal resistance. If the cover member is highly resistant to heat, all of the portions other than those connected with solder can completely be covered to contribute to a further improvement in design and the exposed portions (those connected with solder) can also be reduced to further enhance insulation.

Figure 12:
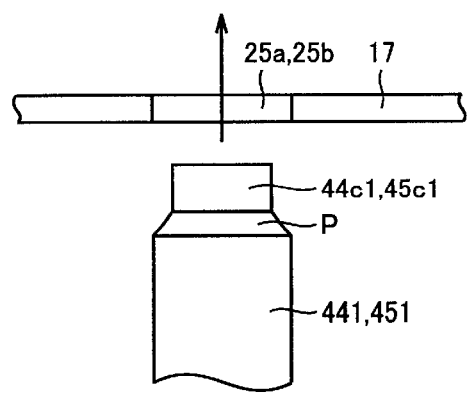
FIG. 12 illustrates a geometry of a tip of the cover member.
Figure 13A:
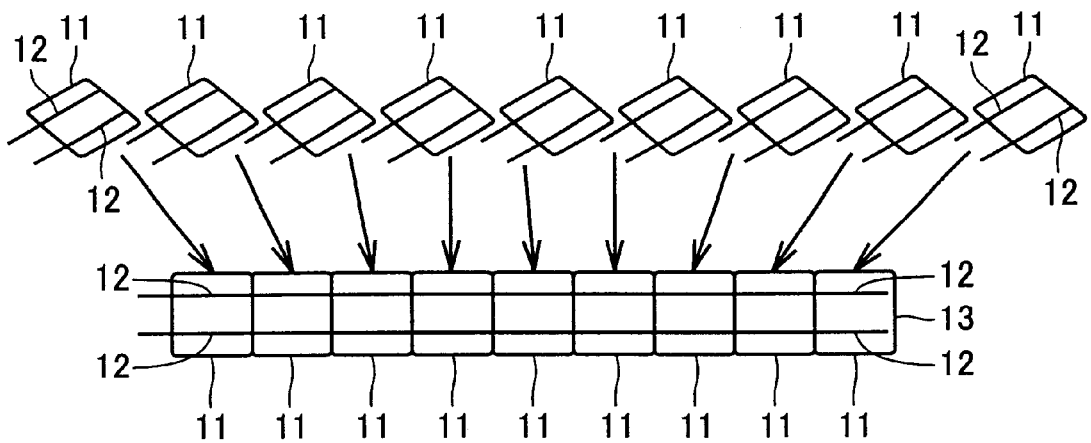
FIGS. 13A and 13B illustrate a conventional solar battery module fabrication process.
Figure 13B:
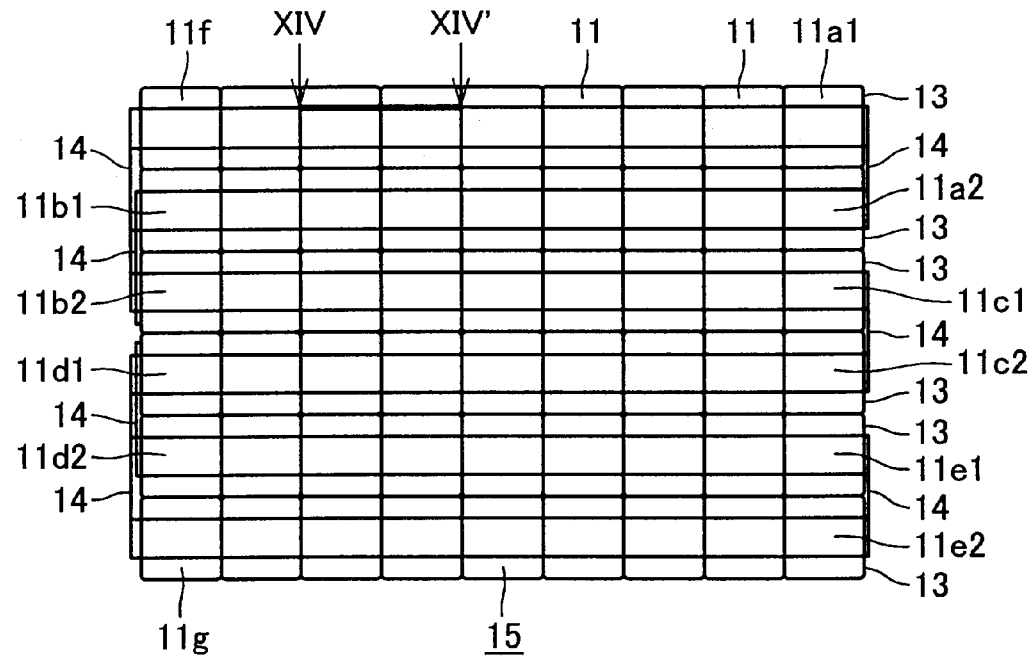
Figure 14A:
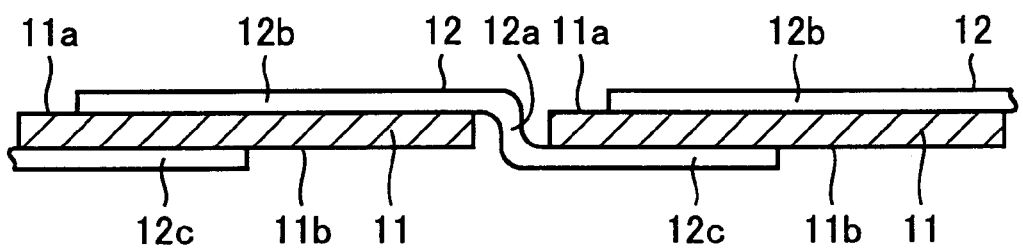
FIG. 14A is a cross section of FIG. 13B taken along a line XIV–XIV'.
Figure 14B:
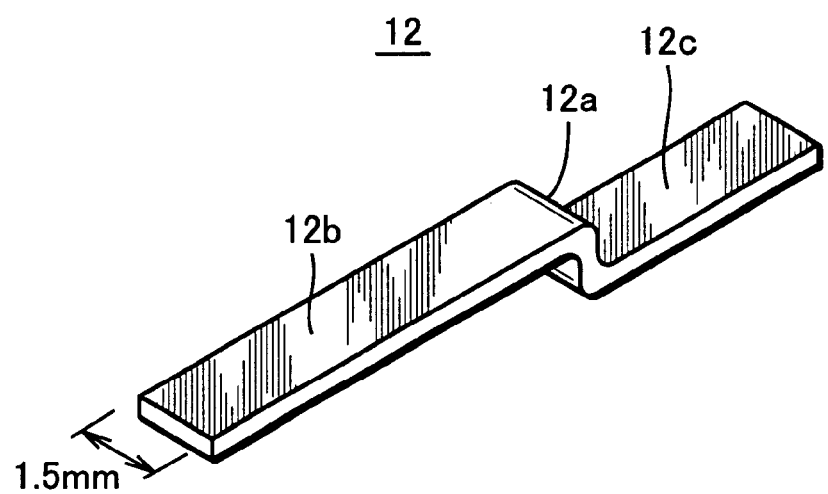
FIG. 14B is a perspective view of connection member 12.
Figure 15:
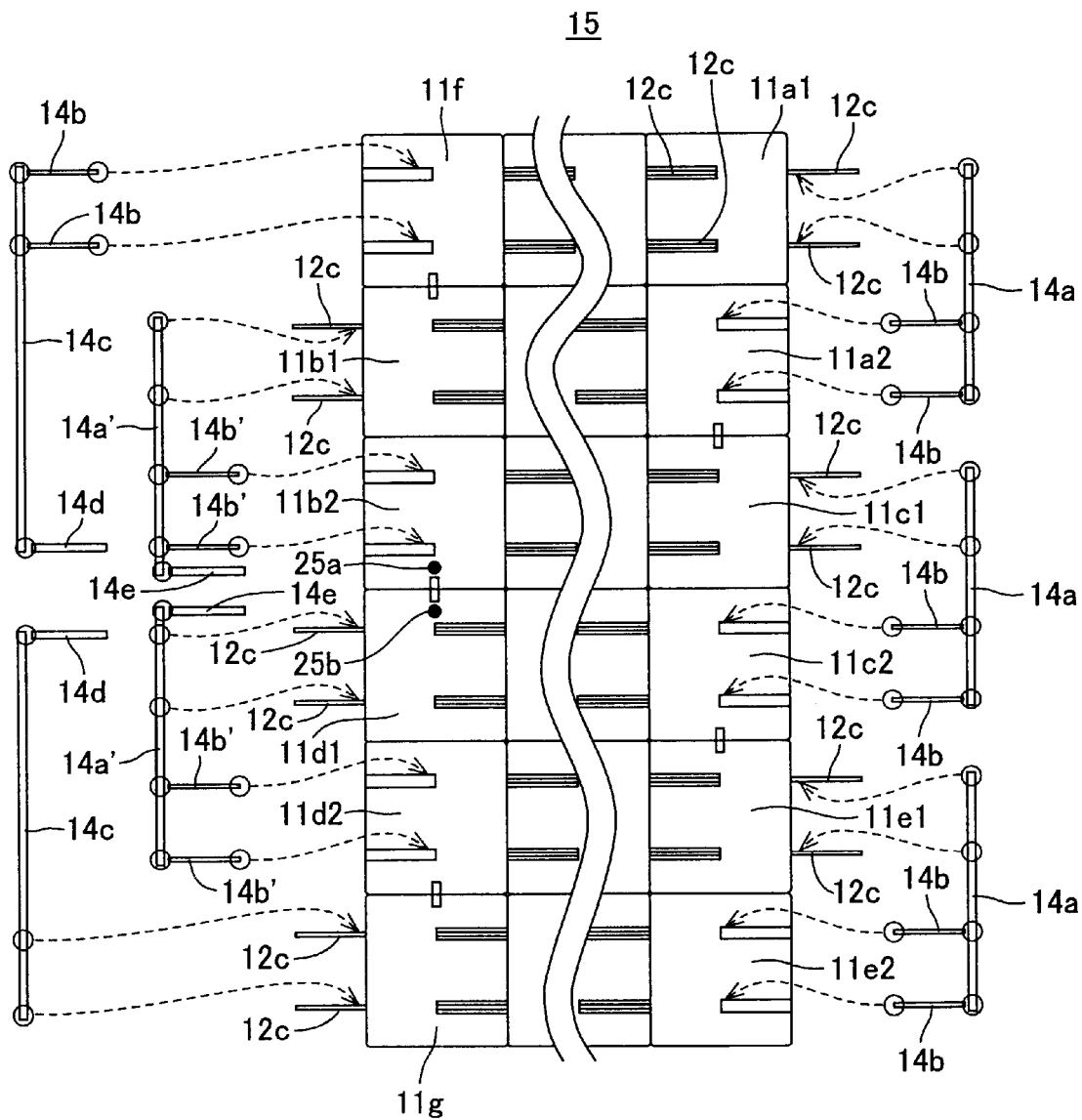
FIG. 15 is a plan view showing solar battery cells being connected together by an interconnection member, as seen from a lower side of the matrix.
Figure 16:
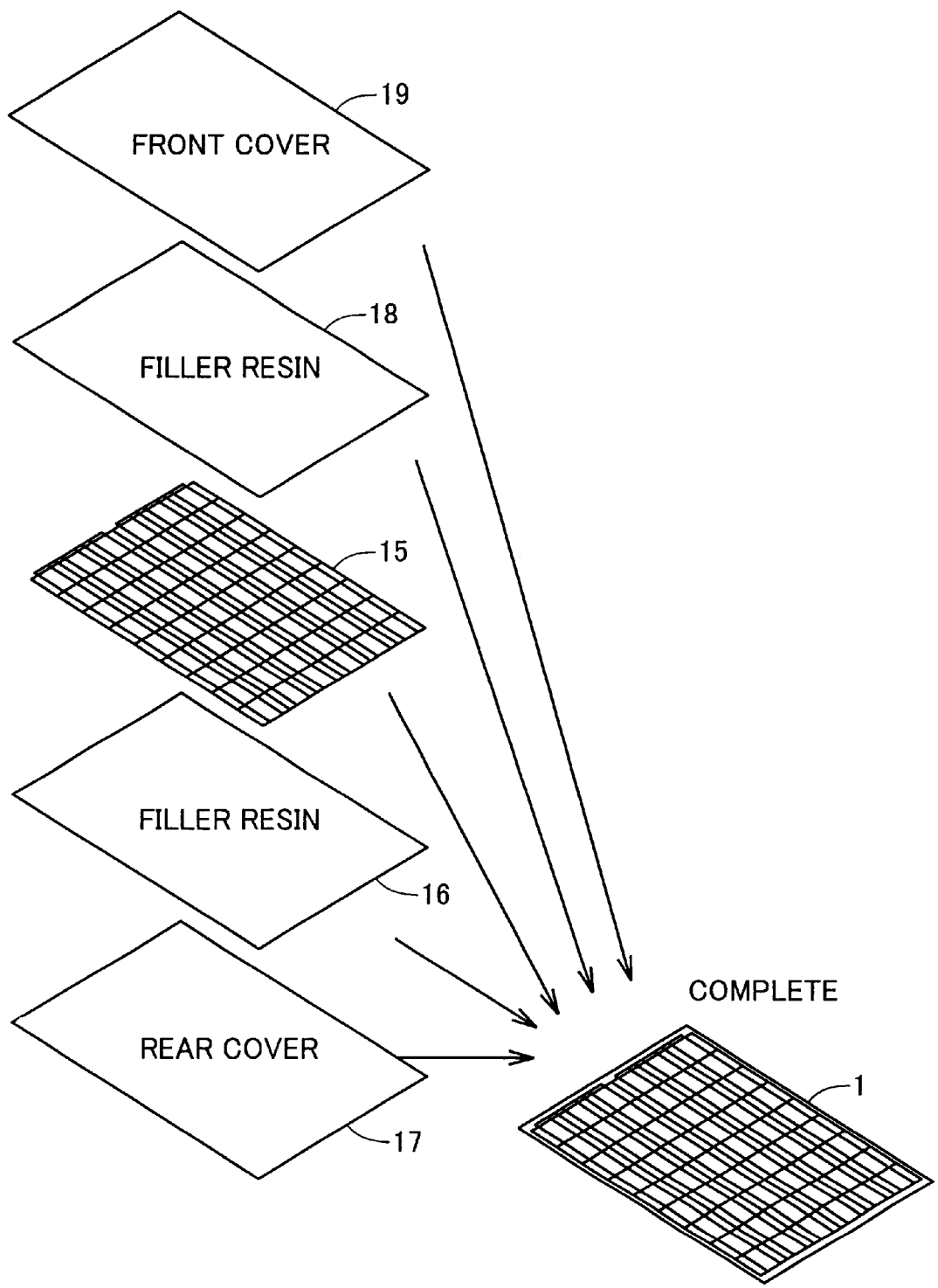
FIG. 16 illustrates a solar battery module fabrication process.
Figure 17:
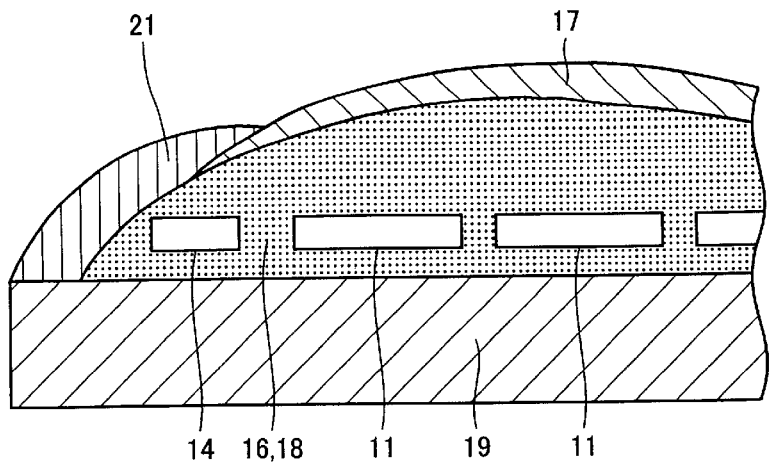
FIG. 17 is a cross section of an end surface of a solar battery module, partially enlarged.
Figure 18A:
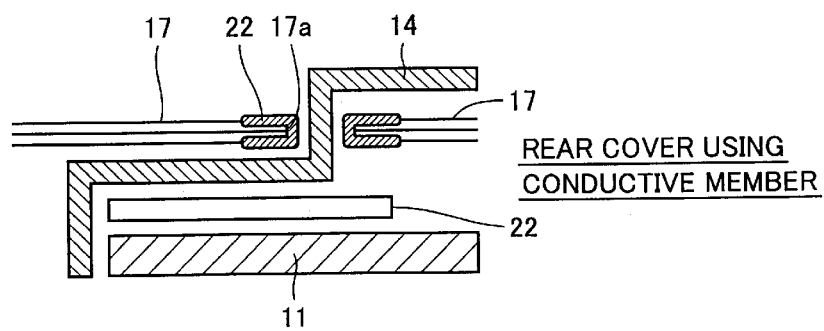
FIG. 18A is a partially enlarged cross section of an interconnection structure for extracting an electrical output through a through hole of a rear cover.
Figure 18B:
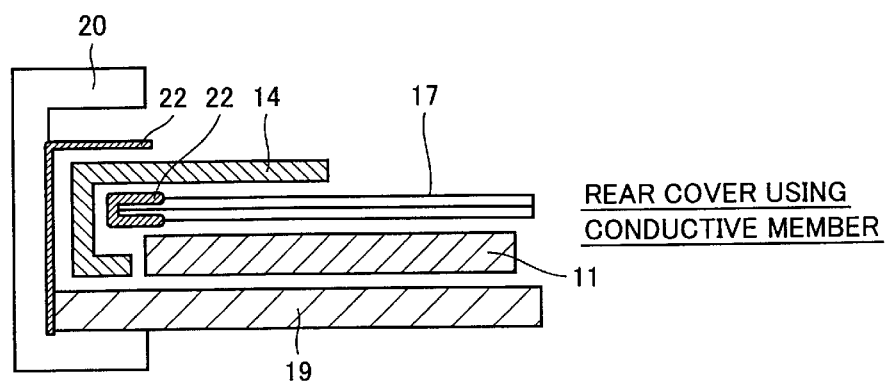
FIG. 18B is a partially enlarged cross section of an interconnection structure for extracting an electrical output from an end surface located between a front cover and a rear cover.
Figure 18C:
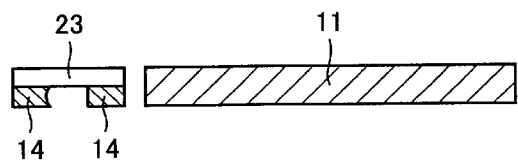
FIG. 18C is a partially enlarged view showing interconnection members stuck with an insulation tape to prevent the members from contacting each other.

Note that a tip of cover member 441 covering piece 44c of the fourth interconnection member 44 and a tip of cover member 451 covering piece 45c of the fifth interconnection member 45 have an obliquely cut and thus tapering surface P, as shown in FIG. 12. When exposed portions 44c1 and 45c1 of the fourth and fifth interconnection members 44 and 45, respectively, are guided externally from electrical output ports 25a and 25b formed at an conductive film serving as rear cover 17, the tip, or tapering surface P, of cover member 441, 451 is not stuck at a periphery of electrical output ports 25a, 25b and can thus be inserted therethrough smoothly.

Interconnection Process

Hereinafter will be described with reference to FIGS. 1–5 an interconnection process using the first to fifth interconnection members 41–45 structured as described above.

Initially, three first interconnection members 41 are respectively arranged along solar battery cells (11a1 and 11a2, 11c1 and 11c2, and 11e1 and 11e2) located at a side edge of matrix 15 and adjacent to each other (see FIG. 2). Then, initially, exposed portions 41a1 and 41a2 of the topmost first interconnection member 41 and the other portions for connection 12c of connection member 12 provided to solar battery cell 11a1 are soldered for example with a soldering iron and thus connected, and the pieces for protrusion 41b of the first interconnection member 41 and an electrode of the bottom side of solar battery cell 11a2 are soldered for example with a soldering iron and thus connected.

Similarly, exposed portions 41a1 and 41a2 of the center first interconnection member 41 and the other portions for connection 12c of connection member 12 provided to solar battery cell 11c1 are soldered for example with a soldering iron and thus connected, and the pieces for protrusion 41b of the first interconnection member 41 and an electrode of the bottom side of solar battery cell 11c2 are soldered for example with a soldering iron and thus connected.

Similarly, exposed portions 41a1 and 41a2 of the bottommost first interconnection member 41 and the other portions for connection 12c of connection member 12 provided to solar battery cell 11e1 are soldered for example with a soldering iron and thus connected, and the pieces for protrusion 41b of the first interconnection member 41 and an electrode of the bottom side of solar battery cell 11e2 are soldered for example with a soldering iron and thus connected.

Then, the second interconnection member 42 is arranged along solar battery cells 11b1 and 11b2 arranged at an edge of matrix 15 at an upper center and adjacent to each other (see FIG. 2). Then, exposed portions 42a1 and 42a2 of the second interconnection member 42 and the other portions for connection 12c of connection member 12 provided to solar battery cell 11b1 are soldered for example with a soldering iron and thus connected, and the pieces for protrusion 42b of the second interconnection member 42 and an electrode of the bottom side of solar battery cell 11b2 are soldered for example with a soldering iron and thus connected.

Then, the third interconnection member 43 is arranged along solar battery cells 11d1 and 11d2 arranged at an edge of matrix 15 at a lower center and adjacent to each other (see FIG. 2). Then, exposed portions 43a1 and 43a2 of the third interconnection member 43 and the other portions for connection 12c of connection member 12 provided to solar battery cell 11d1 are soldered for example with a soldering iron and thus connected, and the pieces for protrusion 43b of the third interconnection member 43 and an electrode of the bottom side of solar battery cell 11d2 are soldered for example with a soldering iron and thus connected.

Subsequently, a bypass diode (not shown) is connected between tip 42c1 of the piece for protrusion 42c of the second interconnection member 42 and tip 43c1 of the piece for protrusion 43c of the third interconnection member 43.

Then, the fourth interconnection member 44 is arranged along a side edge of matrix 15 to extend from the center to an end (see FIG. 3). Then, the pieces for protrusion 44b of the fourth interconnection member 44 and an electrode of the bottom side of solar battery cell 11f are soldered for example with a soldering iron and thus connected, and tip 44c1 of the piece for protrusion 44c of the fourth interconnection member 44 is guided externally from electrical output port 25a.

Then the fifth interconnection member 45 is arranged along a side edge of matrix 15 to extend from a center to an end (see FIG. 3). Then, exposed portions 45a1, 45a2 of the fifth interconnection member 45 and the other portions for connection 12c of connection member 12 provided to solar battery cell 11g are soldered for example with a soldering iron and thus connected, and tip 45c1 of the piece for protrusion 45c of the fifth interconnection member 45 is guided externally from external output port 25b.

Figure 4:
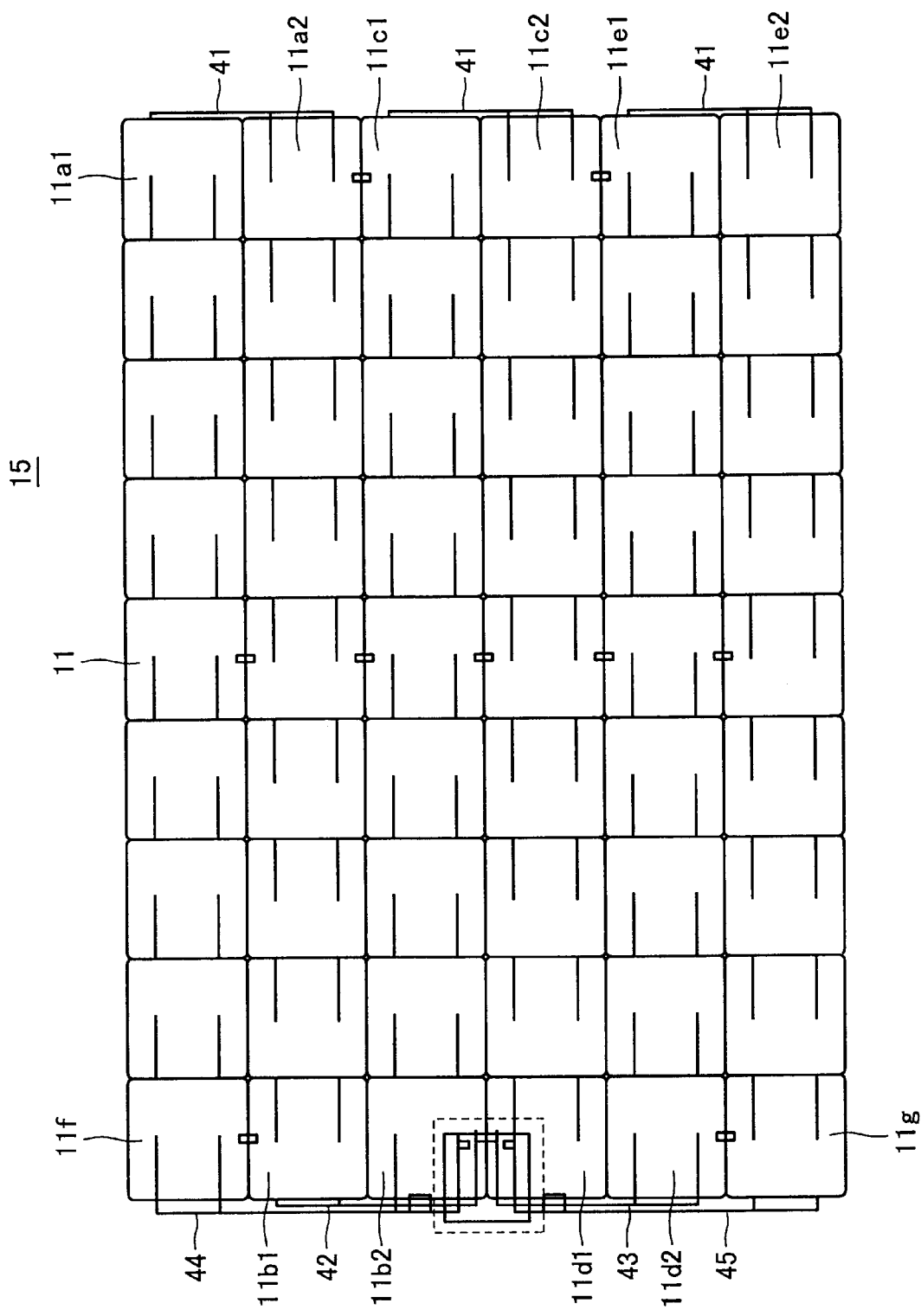
Figure 5:
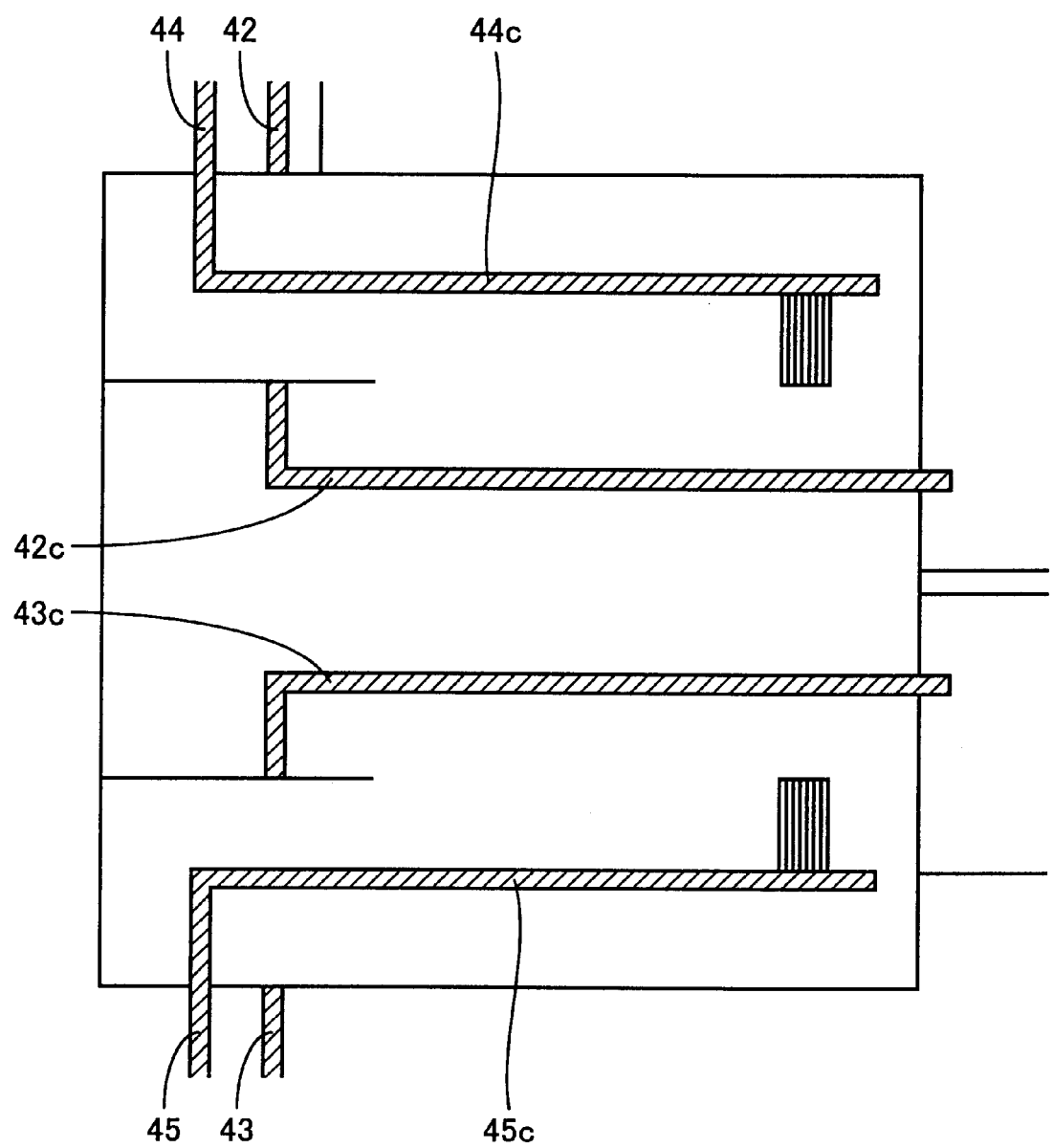
FIG. 5 is a partially enlarged view showing a positional relationship of an interconnection member in a vicinity of an electrical output port.

FIGS. 3 and 4 show a condition provided when the interconnection process is completed. Note that the other portions for connection 12c protruding from a side edge of matrix 15 are cut off, as indicated in FIG. 3 by a broken line, after the interconnection process ends. Also note that FIG. 5 is a partially enlarged view showing a positional relationship of an interconnection member in a vicinity of electrical output ports 25a, 25b.

Note that in FIG. 1, the portions to be soldered are circled. By using the first to fifth interconnection members 41–45 formed as described in the present embodiment, the conventional, 42 portions to be soldered for connection can be reduced to 24 portions and accordingly the soldering process for connection can be simplified and the time therefor can be reduced.

Furthermore, the interconnection member that is formed to be a single member can eliminate the necessity of the step of cutting a solder-plated copper line on the spot and the first to fifth interconnection members 41–45 that are covered with insulative members 441–451 can eliminate the necessity of using film, tape and the like for insulation, as described in the conventional art, and the working efficiency can significantly be increased.

Furthermore, while a solar battery module has an end surface sealed typically with a member formed of silicone resin, EVA resin or other similar material that liquefies once in fabricating the solar battery module, the first to fifth interconnection members 41–45 that are covered with PET or any other similar highly insulative and water proof member allow cover members 411–451 to provide protection to significantly reduce the possibility that an unsatisfactorily insulated product is produced if the silicone resin, EVA resin or the like should have air bubbles therein or peel off.

Furthermore, when the first to fifth interconnection members 41–45 covered with cover members 411–451 in use and those uncovered as conventional in use are compared with each other in appearance, the latter provides three whitish lines clearly appearing along a frame of the solar battery module. This is still observed clearly in lines, as seen under a roof, when several tens sheets of such solar battery modules are installed on the roof. This provides the roof member with an impaired design.

By contrast, the present solar battery module uses cover members 411–451 colored in black to completely hide a portion at which a whitish, solder-plated copper line is noticeable. As such, when several tens sheets of such solar battery modules are installed on a roof and observed under the roof, it is entirely black and thus sufficiently tolerable as a roof member in terms of design.

Note that in the above embodiment a cover member covers all of the portions of the first to fifth interconnection members 41–45 except for an (exposed) portion soldered and thus connected to the other portion for connection 12c of connection member 12 provided to a solar battery cell. However, the pieces for protrusion 42c, 43c, 44c and 45c of the second to fifth interconnection members 42–45, respectively, when the soldering process for connection is completed are hid on the bottom side of the solar battery module and they are not observed from a front side of the solar battery module. Thus, the cover member for these portions can be dispensed with. Furthermore, the first to fifth interconnection members 41–45 may have each piece for linkage partially free of the cover member if the piece is not noticeable when it seen from a front side of the solar battery module.

In a solar battery module of the present invention an interconnection member excluding a portion for connection can entirely or partially be covered with an insulative cover member to improve insulation and design. Furthermore, the cover member that is similar in color to a member surrounding the same can be integrated into a color of a surface of the solar battery module and thus provide a further improvement in design. By contrast, the cover member that is different in color from the surrounding member to be a factor in design can also provide an improvement in design.

Furthermore, the solar battery module has an end surface sealed with a member formed of silicone resin, EVA resin or other similar material that liquefies once in fabricating the solar battery module. As such, air bubbles readily form therein and it may peel off. The interconnection member that is covered with an insulative member ensures isolation between the interconnection member and other surrounding members sufficiently.

Furthermore in the solar battery module of the present invention adjacent solar battery cells are connected together by an interconnection member formed in a connectable geometry to simplify soldering for connection in a solar battery module production process at an interconnection step in particular and thus significantly reduce process time.

Furthermore in the present method of fabricating a solar battery module the interconnection member is formed to match a geometry of a site for connection and the interconnection member thus formed is arranged at a site for connection and a connection terminal of a solar battery cell and a portion of the interconnection member for connection are soldered and thus connected to each other. The interconnection member thus formed to be a single member can simplify soldering for connection in a solar battery module production process at an interconnection step in particular and thus significantly reduce process time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery module having a plurality of solar battery cells linearly arranged and electrically connected together to form a cell unit, more than one said cell unit being arranged laterally side by side, either solar battery cells located at opposite ends of said cell units and adjacent to each other or an electrical output port and said solar battery cell being electrically connected by an interconnection member to allow a matrix of said solar battery cells to be entirely connected in series, characterized in that said interconnection member excluding a portion thereof for connection is at least partially covered by a cover member.

2. The module of claim 1, wherein said interconnection member is a conductive electric wire in a form of a flat plate.

3. The module of claim 1, wherein said cover member is an insulative member.

4. The module of claim 1, wherein said cover member is similar in color to a member surrounding said cover member.

5. The module of claim 1, wherein said cover member is different in color from a member surrounding said cover member.

6. The module of claim 1, wherein said interconnection member connects adjacent solar battery cells together and said interconnection member excluding a portion thereof for connection is formed in a covered geometry.

7. The module of claim 1, wherein said interconnection member electrically connects said solar battery cell and a terminal external to said electrical output port together and said interconnection member excluding a portion thereof for connection is formed in a covered geometry.

8. The module of claim 1, wherein said interconnection member has a portion for connection either on a piece for linkage of said interconnection member at an interval or protruding from said piece for linkage outwards.

9. The module of claim 6, wherein said interconnection member is integrally formed generally in a letter L, F or E to match a site for connection.

10. A method of fabricating a solar battery module, comprising the steps of: a) linearly arranging and electrically connecting a plurality of solar battery cells together to form a cell unit; and b) arranging more than one said cell unit laterally side by side and electrically connecting either said solar battery cells located at opposite ends of said cell units and adjacent to each other or an electrical output port and said solar battery cell together by an interconnection member, characterized in that said interconnection member is formed to match a geometry of a site for connection and in the step b) said interconnection member thus formed is arranged at said site for connection and a connection terminal of said solar battery cell and a portion of said interconnection member for connection are soldered and thus connected to each other.

* * * * *